United States Patent
Molva et al.

[11] Patent Number: 5,933,444
[45] Date of Patent: Aug. 3, 1999

[54] MONOLITHIC SEMICONDUCTOR INFRARED EMITTER PUMPED BY A SWITCHED SOLID MICROLASER

[75] Inventors: Engin Molva; Jean-Louis Pautrat, both of Grenoble, France

[73] Assignee: Commissariat A L'Energie Atomique, Paris, France

[21] Appl. No.: 08/637,277

[22] Filed: Apr. 25, 1996

[30] Foreign Application Priority Data

May 12, 1995 [FR] France ..................... 95 05655

[51] Int. Cl.$^6$ .............. H01S 3/091; H01S 3/094
[52] U.S. Cl. .................................................. 372/75
[58] Field of Search .................. 372/11, 98, 75

[56] References Cited

U.S. PATENT DOCUMENTS

| | | |
|---|---|---|
| 4,982,405 | 1/1991 | Zayhowski et al. . |
| 5,048,051 | 9/1991 | Zayhowski . |
| 5,278,855 | 1/1994 | Jacobovitz-Veselka et al. ......... 372/11 |
| 5,394,413 | 2/1995 | Zayhowski . |
| 5,495,494 | 2/1996 | Molva et al. ............... 372/11 |
| 5,502,737 | 3/1996 | Chartier et al. ............ 372/11 |

FOREIGN PATENT DOCUMENTS

| | | |
|---|---|---|
| 0 432 009 | 6/1991 | European Pat. Off. . |
| 0 523 861 | 1/1993 | European Pat. Off. . |
| 0 588 327 | 3/1994 | European Pat. Off. . |

OTHER PUBLICATIONS

Aleksanyan et al; "Swemiconductor laser made of Bi Sb";Sov. J. Quantum Electron. 14(3), Mar. 1984.

IEEE Journal of Quantum Electronics, vol. QE–18, No. 4, Apr. 1982, pp. 511–513, J. Stone, et al., "Tunable InGaAsP Lasers for Spectral Measurements of High Bandwidth Fibers".

Optics Letters, vol. 6, No. 11, Nov. 1981, pp. 534–536, J. Stone, et al., "Optically Pumped Ultrashort Cavity In1–xGaxAsyP1–y Lasers: Picosecond Operation Between 0.83 and 1.59 $\mu$m".

Soviet Journal of Quantum Electronics, vol. 14, No. 3, Mar. 1984, pp. 336–338, A. G. Aleksanyan, et al., "Semiconductor Laser Made of Bi1–xSbx".

Optics Letters, vol. 10, No. 5, May 1985, pp. 232–234, C. S. Lee, et al., "Observation of Optical Bistability Due to Resonator Configuration Transition".

Appl. Phys. Lett., vol. 58, No. 4, Jan. 28, 1991, pp. 343–345, Z. Feit, et al., "Single–Mode Molecular Beam Epitaxy Grown PbEuSeTe/PbTe Buried–Heterostructure Diode Lasers for CO2 High–Resolution Spectroscopy".

Appl. Phys. Lett., vol. 55, No. 26, Dec. 25, 1989, pp. 2704–2706, A. Ravid, et al., "Optically Pumped Laser Oscillation at ≈2.9$\mu$m Of A HgCdTe Layer Grown By Metalorganic Chemical Vapor Deposition".

Appl. Phys. Lett., vol. 55, No. 19, Nov. 6, 1989, pp. 2026–2028, N. C. Giles, et al., "Stimulated Emission at 2.8$\mu$m From Hg–Based Quantum Well Structures Grown By Photoassisted Molecular Beam Epitaxy".

Journal of Crystal Growth, vol. 117, 1992, pp. 1046–1049, J. Bleuse, et al., "Room–Temperature Laser Emission Near 2 $\mu$m From an Optically Pumped HgCdTe Separate–Confinement Heterostructure" No Month.

Optics Communications, vol. 10, No. 1, Jan. 1974, pp. 18–20, K. H. Drexhage, et al., "New Dye Solutions For Mode–Locking Infrared Lasers".

(List continued on next page.)

*Primary Examiner*—Rodney Bovernick
*Assistant Examiner*—Robert E. Wise
*Attorney, Agent, or Firm*—Oblon, Spivak, McClelland, Maier & Neustadt, P.C.

[57] ABSTRACT

The invention relates to a device for an infrared light emitter comprising a semiconductor element (12) able to emit infrared radiation and a switched microlaser (2, 4, 6, 8) arranged so as to be able to optically pump the semiconductor element.

44 Claims, 8 Drawing Sheets

OTHER PUBLICATIONS

Cleo, 1992, p. 282, A. Eda, et al., "CWG33 Microchip Lasers Fabricated By a Novel Photolithography Technique" No Month.

Optics Letters, vol. 17, No. 17, Sep. 1, 1992, pp. 1201–1203, J. J. Zayhowski, et al., "Diode–Pumped Microchip Lasers Electro–Optically Q Switched At High Pulse Repetition Rates".

IEEE Journal of Quantum Electronics, vol. 24, No. 9, Sep. 1988, pp. 1845–1855, Kenichi Iga, et al., "Surface Emitting Semiconductor Lasers".

Appl. Phys. Lett., vol. 55, No. 1, Jul. 3, 1989, pp. 16–18, Z. Feit, et al., "Low–Threshold PbEuSeTe Double–Heterostructure Lasers Grown By Molecular Beam Epitaxy".

Semicond. Sci. Technol., 1990, pp. S12–S19, H. Preler, "Physics and Applications of IV–VI Compound Semiconductor Lasers" No Month.

Mol. Cryst. Liq. Cryst., 1990, vol. 183, pp. 291–302, U. T. Mueller–Westerhoff, et al., "Near–IR Dyes For the 1.3 to 1.5 Micron Region: The Use of Substituted Dithiolene Complexes" No Month.

MONOLITHIC SEMICONDUCTOR INFRARED EMITTER PUMPED BY A SWITCHED SOLID MICROLASER

BACKGROUND OF THE INVENTION

Field of the Invention

The technical field of the invention is that of infrared light emitters, particularly in the low power range of 1 to 20 µm, which can be used for applications such as gas absorption spectroscopy, gas detection, chemical species detection and pollutant detection. These emitters can be "coherent" (e.g. a laser diode) or "incoherent" (e.g. a light emitting diode).

DISCUSSION OF BACKGROUND

Laser diodes (coherent emission) and light emitting diodes (incoherent emission) are known and widely used in numerous applications. These diodes are produced from semiconductor materials such as GaAlAs or GaAsP or GaInAs or GaInAsP, etc. The accessible wavelengths are between 0.6 and 1.5 µm.

The main advantage of these structures is the possibility of being able to choose a priori a specific wavelength in the range accessible to the material. The wavelength of a semiconductor emitter can be continuously chosen in a relatively wide range by modifying either the composition of the alloys, or the physical characteristics of the semiconductor structures used in the light emitting devices.

Unfortunately, the semiconductor emitters, which are well known and controlled, emit in a limited wavelength range not exceeding 1.5 µm and the wavelength which can be emitted is essentially determined by the semiconductor forbidden band width.

However, numerous applications and in particular those referred to hereinbefore require wavelengths beyond 1.5 µm and up to 3, 5, 10 or 20 µm.

Certain semiconductor alloys such as e.g. II–VI compounds (CdHgTe), III–V compounds (GaAlAsSb, InAsSb) or IV–VI compounds (lead salts) have band widths making it possible to produce infrared light emitters in an interesting wavelength range, i.e. between 1 and 5 µm or even between 1 and 40 µm.

They can be made to operate in optical pumping with the aid of a semiconductor-absorbed pumping laser (optical pumping semiconductor laser). This makes it possible to obtain freedom from technical problems associated with the implementation of electrical injection diode structures (doping and electrical contact problems poorly controlled in these materials).

However, the existing technologies which would make it possible to implement structures of the laser diode or light emitting diode type in order to obtain an emission at a wavelength above a few micrometers are very poorly mastered. In particular, these structures function at a very low temperature.

For example, laser diodes based on lead salts ($Pb_xSn_{1-x}Se$, $Pb_xSn_{1-x}Te$, $PbS_{1-x}Se_x$, $Cd_xPb_{1-d}S$) make it possible to obtain wavelengths $\lambda > 1$ µm (up to 40 µm), but for a temperature T<160 K. In the same way, alloys of the type InAsSb ($InAs_xSb_{1-x}$) on an InAs substrate can operate at T<160 K to give a wavelength emission between 2.9 and 3.6 µm. Reference can be made in this connection to the article by H. Preler "Physics and applications of IV–VI compound semiconductor lasers", published in Semiconductor Science and Technology, vol. 5, S12–S20, 1990, that by N. C. Giles et al "Stimulated emission at 2.8 µm from Hg-based quantum well structures grown by photo-assisted molecular beam epitaxy", published in Applied Physics Letters, vol. 55, pp 202–2028, 1992, that of Z. Feit et al "Single mode molecular beam epitaxy grown PbEuSeTe/PbTe buried-heterostructure diode lasers", published in Applied Physics Letters, vol. 58, pp 343–345, 1991, and that of Z. Feit et al, "Low-threshold PbEuSeTe double-heterostructure lasers", published in Applied Physics Letters, vol. 55, p 16 ff. The article by A. Ravid et al entitled "Optically pumped laser oscillation at 2.5 µm of a CdHgTe layer grown by metalorganic chemical vapor deposition", published in Applied Physics Letters, vol. 55, pp 2704–2706, 1989 gives a maximum operating temperature of 150 K.

Compounds able to operate at ambient temperature do not make it possible to obtain wavelengths above 3 µm (quaternary alloys $Ga_{1-x}Al_xAs_ySb_{1-y}$ for a laser emission between 1.8 and 2.4 µm). A wavelength of 2 µm has been obtained for a semiconductor $Hg_{0.51}Cd_{0.49}Te$ at ambient temperature and this is described in the article by J. Bleuse et al entitled "Room-temperature laser emission bear 2 µm from an optically pumped HgCdTe separate confinement structure", published in Journal of Crystal Growth, 117, 1992, pp 1046–1049.

All these articles demonstrate that the temperature problem is a constant preoccupation in this field and has not really been solved.

In addition, structures operating at several µm (lead salts) are even more difficult to implement in that they require high injection currents and thresholds.

The power obtained with the known structures is generally very low (less than 1 mW) and devices incorporating such structures are fragile. Therefore it is difficult to envisage an industrial application of such devices.

SUMMARY OF THE INVENTION

The present invention proposes a device making it possible to obtain a coherent emission (laser) or incoherent emission, at a specific, given wavelength corresponding to a clearly defined application (e.g. the absorption wavelength of a polluting gas) and able to function at ambient temperature.

More specifically, the invention relates to a device for an infrared light emitter incorporating a semiconductor element able to emit infrared radiation and a switched microlaser arranged in such a way as to be able to optically pump the semiconductor element.

The interest of the optical pumping of the semiconductor is that it does not require the implementation of an injection diode structure obtained with p and n dopings, ohmic contacts and etching technologies. This makes it possible to use any random semiconductor for obtaining an infrared emitter without the difficulty of producing an injection diode.

According to the invention, a microlaser is used as the semiconductor optical pumping source. The microlaser is an integratable, robust, compact source for obtaining a monolithic structure, which has sufficient power to reach the laser threshold of any random semiconductor, even those having very high thresholds and no matter what the temperature. At the microlaser output it is possible to obtain several kW peak on a diameter of 20 to 100 µm or power densities of a few dozen magawatts/cm². This power density makes it possible to obtain an optical pumping of most known semiconductors. The power emitted by the semiconductor is then typically several dozen mW.

In addition, another problem simultaneously solved by the invention is that of the width of the pumping pulses. A pumping source supplying an adequate power but with excessively wide pulses from the time standpoint would lead to a heat load prejudicial to the operation of the semiconductor. However, as a result of a limited cavity length (≦1 mm) of the switched microlasers, their pulses are short (typically <1 ns or at most 5 ns), which avoids the aforementioned harmful heat load.

At the same time this short pulse duration is compatible with life periods of the excited states of semiconductors which are very short (a few 100 picoseconds to 1 ns).

Finally, the use of a microlaser makes it possible to achieve great compactness. One of the advantages of the microlaser is its structure in the form of a stack of multilayers. The active laser medium is constituted by a material of limited thickness between 150 and 1000 $\mu$m and small dimensions of a few $mm^2$, on which are directly deposited dielectric cavity mirrors. As the semiconductor is also in the form of a thin plate with a typical thickness of about 500 $\mu$m, the device according to the invention is very compact.

Finally, as the microlaser is a robust source, which can be easily integrated and mass produced using microelectronics technologies and therefore at low cost, the device according to the invention benefits from all these advantages.

The semiconductor element can be in the form of a plate with a thickness of a few hundred micrometers, e.g. below 500 $\mu$m. This element can also be in the form of a coating or film epitaxied on a substrate.

The semiconductor can be chosen from among known II–VI, III–V or IV–VI alloys in order to emit a correct wavelength.

The invention can be used with particular advantage for semiconductors, whose emission is entirely or at least partly at a wavelength above 3 $\mu$m ($\lambda \geq 3$ $\mu$m) or 2 $\mu$m ($\lambda \geq 2$ $\mu$m).

It is e.g. possible to obtain structures in $Pb_xSn_{1-x}Se$ (7≦λ emission ≦40 $\mu$m), in $Pb_xSn_{1-x}Te$ (6 $\mu$m ≦λemission ≦40 $\mu$m), in $PbS_{1-x}Se_x$ (3–8 $\mu$m), in $Cd_xPb_{1-x}S$ (1–4 $\mu$m) or in $Cd_xHg_{1-x}Te$ (1–15 $\mu$m).

It is also possible to use all known structures operating at ambient temperature and emitting in the range 1–3 $\mu$m ($In_xGa_{1-x}As$, $CdS_xSe_{1-x}$, etc.).

According to another embodiment of the invention, the semiconductor element is directly fixed to the output face of the microlaser. At least one of the faces of the semiconductor can be given an antireflection treatment.

The structure of the semiconductor device according to the invention makes it possible, as a function of the particular case, either to emit an incoherent beam (photoluminescence emission equivalent to the emission of a light emitting diode) or a coherent laser beam.

The semiconductor element can consequently form part of a semiconductor laser, particularly a semiconductor laser cavity. This laser can e.g. be of the VCSEL type (Vertical Cavity Surface Emitting Laser).

The semiconductor laser can also be of the waveguide type, the semiconductor element being in the form of a film deposited on a substrate. In addition, the film can be oriented in a plane perpendicular to the direction of the beam emitted by the microlaser.

According to an embodiment, the microlaser cavity is passively switched by a saturable absorber.

Another aspect of the invention relates to the relative arrangement of the saturable absorber and the active medium within the microlaser cavity.

According to this embodiment, the saturable absorber can be deposited in thin film form directly on the microlaser cavity active material.

One of the main advantages of this embodiment is in the structure of the microlaser cavity (or laser microsystem consisting of a microlaser associated with microoptics) in switched form, which then consists of a stack of films, making it possible to retain the possibility of low cost, mass production. This multilayer structure does not cause problems with regards to the simplicity and mass production and therefore low cost processes of the microlasers such as have been developed for continuous microlasers. It makes it possible to obtain fool-proof, self-aligned (no optical setting), monolithic, passively switched microlasers. This structure requires no bonding or adhesion operation (unlike solutions consisting of bonding the saturable absorber to another microlaser cavity element) and no complex alignment operation (unlike solutions consisting of placing the saturable absorber without any contact with the other elements of the microlaser cavity).

Another advantage of the microlaser compared with the "codoped" laser (the same medium containing both active laser ions and saturable absorber ions) is that the active medium is separated from the saturable absorber and the bonding of the two media is avoided, whilst maintaining a monolithic structure. Thus, it is possible to on the one hand independently regulate the thicknesses (during the deposition of the films or by mechanical thinning after the deposition of the films) and the concentrations of the ions in the two media and on the other, as a result of said separation, to obtain switched lasers where the same ion (e.g. Er) can be used as the active ion and as the saturable absorber with different concentrations.

According to another aspect of the invention, the film can be formed by an organic dye dissolved in a polymer solvent. According to a variant, the film can be deposited by liquid phase epitaxy. The microlaser cavity can also be actively switched.

In the field of microlasers, an active switching procedure is described in the article by J. J. Zayhowski et al entitled "Diode-pumped microchip lasers electro-optically Q switched at high pulse repetition rates" published in Optics Letters, vol. 17, No. 17, pp 1201–1203, 1992 and this procedure can be used in the present invention.

In this document, switching is carried out in a configuration of two coupled Fabry-Perot cavities. The active laser medium of length $L_1$ forms with an input mirror and an intermediate mirror a first Fabry-Perot cavity. The switching material (electrooptical material, $LiTaO_3$) of length $L_2$ forms with the intermediate mirror and the output mirror a second Fabry-Perot cavity. Switching takes place by modifying the optical length of the switching material by an external action. Switching electrodes are placed perpendicular to the laser beam axis on either side of the switching material. If a voltage V is applied between these electrodes, an electric field E-V/e, in which e is the distance between the electrodes (which corresponds to the electrooptical material thickness) results therefrom. The optical index $n_2$ and consequently the optical length $n_2L_2$ of the electrooptical material is modified by the action of the field E. This affects the coupling of the two Fabry-Perot cavities and modifies the reflectivity of the intermediate mirror seen by the laser medium. However, this method suffers from disadvantages.

Firstly, the microlaser described in this document is produced by a manual process (it involves stages of bonding precut fragments). This imposes a lower limit for the geometrical dimensions, which are at a minimum around 1 mm, and in particular for the distance between the two electrodes. Another problem is the need to reach an adequate field E for switching. It is in fact necessary to apply a voltage of approximately 1000 V between the two electrodes in a very short time of less than 1 nanosecond and on laser chips with an approximate volume of 1 mm$^3$. This is very difficult to implement in practice and requires sophisticated electronics incompatible with the simplicity and low cost of microlaser production.

In order to solve this problem and according to a special embodiment of the invention, the active laser medium forms a first resonant cavity between an input mirror and an intermediate mirror, a second material forms a second resonant cavity between the intermediate mirror and an output mirror, the optical index of said material being modulatable by an external disturbance, and laser beam size reducing means are located at the input of the first resonant cavity, the assembly of the two cavities and the laser beam reduction means being monolithic.

Thus, according to this embodiment, the invention solves the problem of the high voltage to be applied between the electrodes, whilst making it possible to reduce the microlaser cavity threshold. Thus, with this structure, it is possible to bring the thickness of the second material to approximately 100 $\mu$m. In the case of an electrooptical material, this makes it possible to limit the voltage necessary to a value between 50 and 100 V. Moreover, the microlaser switching threshold is reduced to a few milliwatts. Finally, this structure is compatible with mass production processes making it possible to manufacture small size samples and respect the necessary production costs.

The laser beam size reduction means can be constituted by a concave mirror produced with a micromirror on the face of the active laser medium to be traversed by the pumping beam. The output mirror can be a concave mirror produced with a micromirror on the output face of the second material. The two Fabry-Perot cavities can be produced so as to be optically stable.

According to a variant making it possible to obtain a microlaser operating in the active mode and having an even more simple structure, the microlaser cavity is at the optical stability limit and means are provided for varying the optical length of the cavity so as to pass it from an optically unstable state to an optically stable state.

Thus, a new active switching is implemented, because the optically unstable state has high cavity losses unlike the optically stable state.

In addition, the structure obtained is radically different from the structure known e.g. from the article of J. J. Zayhowski (cf. hereinbefore), because there is only a single Fabry-Perot cavity.

The cavity can be a hemispherical, confocal, concentric or spherical cavity. In this case, the size of the beam in the cavity is smaller and it is then possible to reduce the thickness of the materials used. The microlaser size is further reduced. This makes it possible to solve one of the problems referred to hereinbefore, namely the high voltage to be applied if the second material is an electrooptical material. Thus, with the thickness of the latter decreasing, the same electric field is obtained for a lower voltage ($\vec{E} = \Delta V/e$, where e is the thickness between the electrodes).

According to an embodiment, the microlaser cavity incorporates, apart from the active laser medium, a second material of variable optical length. However, this still only requires a single Fabry-Perot cavity instead of two. This gives a very compact, monolithic structure.

The means for varying the optical length of the cavity can incorporate means for varying the length of the second material.

According to an embodiment, the active laser medium and the second material have different optical indexes and the means for varying the optical length of the cavity incorporate means for varying the optical index of the second material, which can be an electrooptical material.

Thus, a single microlaser cavity is produced and its optical length modified in order to displace the cavity from the high loss, unstable range to the low loss, stable range, which permits the switching thereof. It is only necessary to have a single Fabry-Perot cavity, even if it contains several materials (the active laser material and the variable optical length material).

When the materials are juxtaposed, bonded or adhere to one another by molecular adhesion, the compactness of the system is improved, which is very important in the case of a microlaser.

BRIEF DESCRIPTION OF THE DRAWINGS

The invention is described in greater detail hereinafter relative to non-limitative embodiments and the attached drawings, wherein show:

Figure 1:
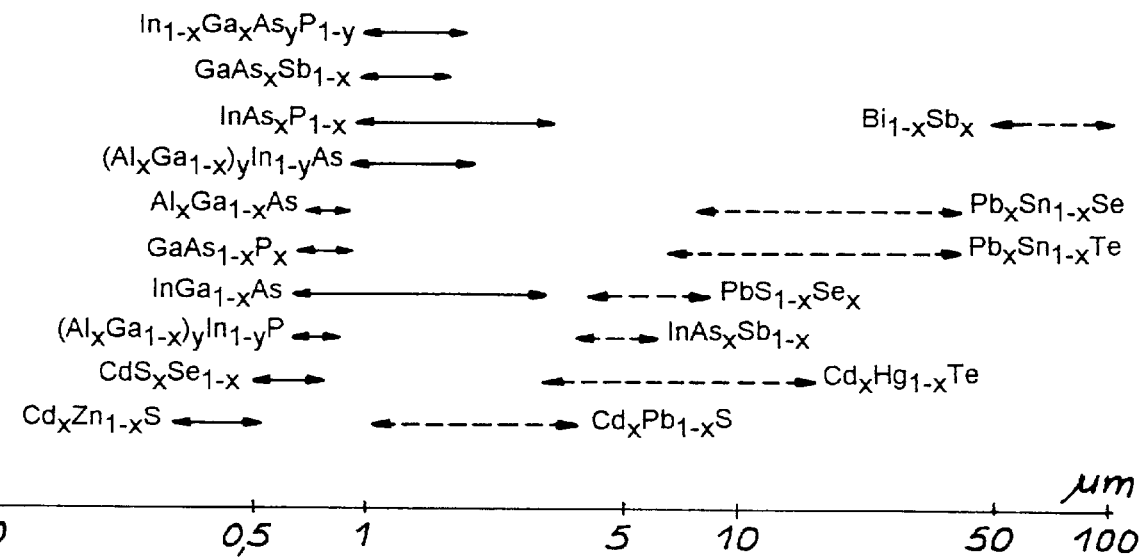
Figure 3:
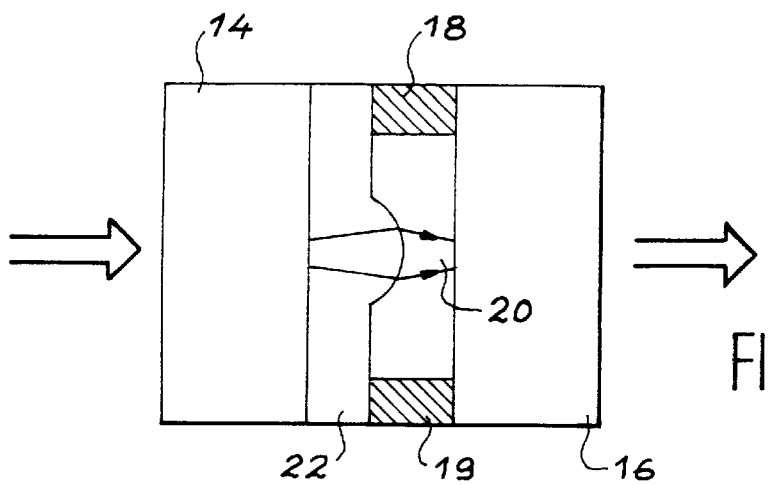
Figure 4A:
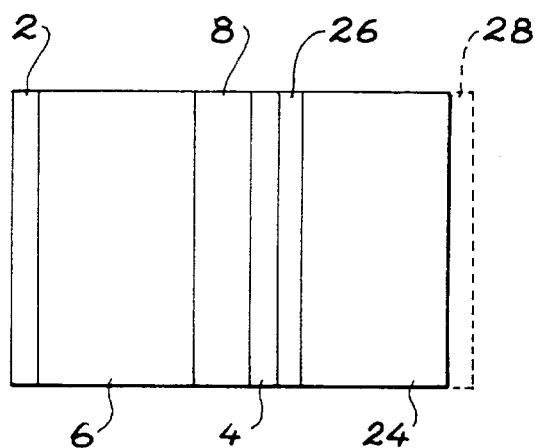
Figure 4B:
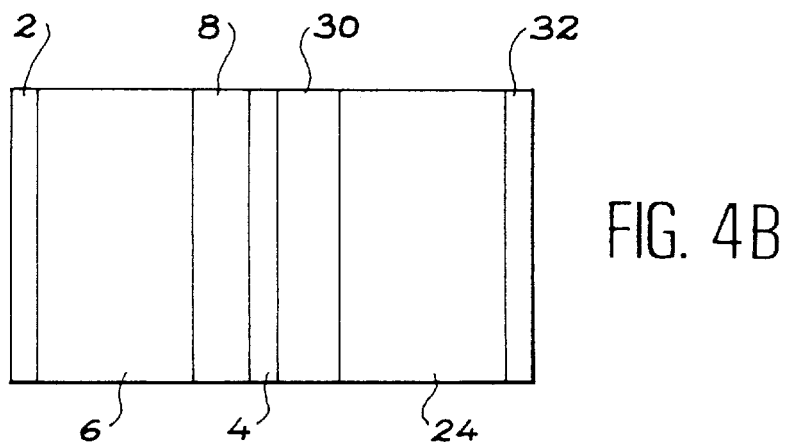
Figure 5:
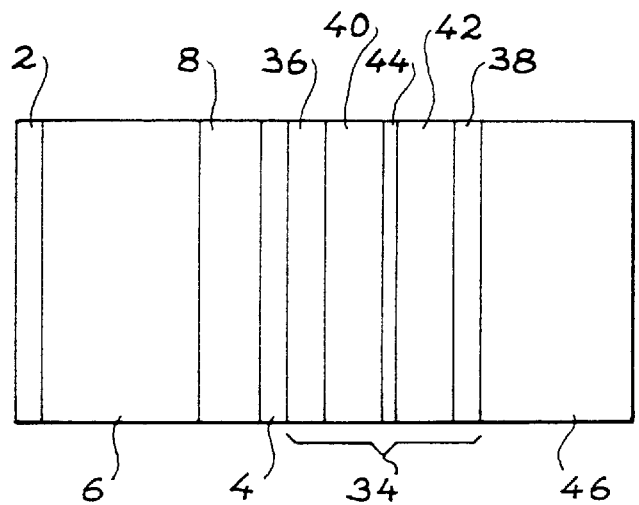
Figure 6:
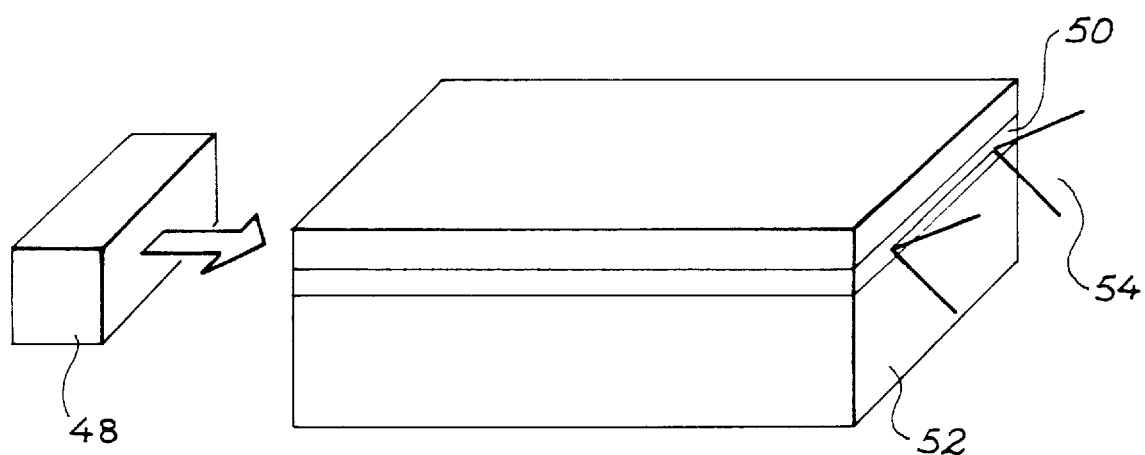
Figure 7:
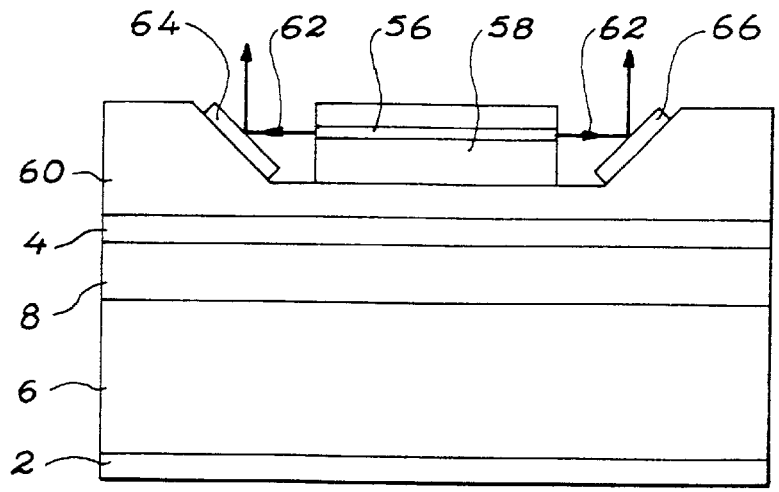
Figure 8:
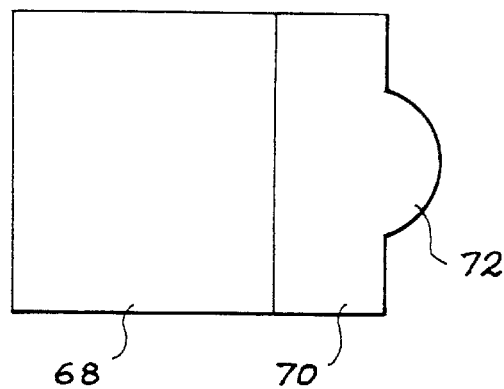
Figure 9:
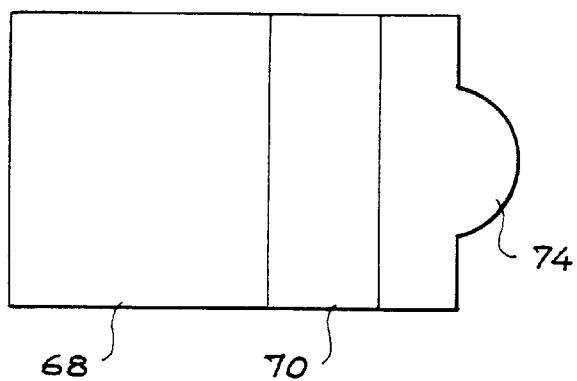

| | |
|---|---|
| FIG. 1 | Semiconductor compositions distributed on the basis of their operating temperature and emission wavelength. |
| FIGS. 2 to 4B | Different embodiments of the invention. |
| FIGS. 5 to 7 | Structures of semiconductor lasers pumped by a microlaser. |
| FIGS. 8 and 9 | Devices according to the invention with a microlens at the semiconductor output. |
| FIGS. 10A to 10E | Stages in the production of a device according to the invention. |
| FIGS. 11 to 17 | Actively switched microlasers. |

DETAILED DESCRIPTION OF EMBODIMENTS

The semiconductor element used in a device according to the invention can be chosen as a function of the wavelength desired by the user. In particular, the semiconductor can be chosen from among known II–VI, III–V or IV–VI alloys. For example, it can be an element such as one of those mentioned in FIG. 1, in conjunction with the corresponding wavelength ranges. The elements located in the right-hand part of FIG. 1 and whose wavelength ranges are indicated by broken line arrows are particularly interesting because they can only be produced in conventional manner at very low temperatures below 160 K. In particular a semiconductor based on $Bi_{1-x}Sb_x$ requires a temperature as low as 16 K in order to be able to operate.

A semiconductor element of a device according to the invention can either be in the form of a plate, e.g. polished on its two faces and with a thickness below a few hundred micrometers, e.g. 500 $\mu$m. According to a variant, it is possible to obtain an epitaxied semiconductor alloy coating, the epitaxy procedures for such alloys being known (liquid phase epitaxy, molecular jet epitaxy, organometallic epitaxy, e.g. the growth of HgCdTe alloy by said latter method is described in the article by A. RAVID referred to in the introduction to the present application). The epitaxy of the film is produced on a substrate which is preferably transparent to the emission wavelength of the semiconductor element. In the case of a CdHgTe-based semiconductor, a CdZnTe substrate with 4% Zn will e.g. be used. Moreover, using said epitaxy procedures, it is possible to obtain heterostructures with or without a quantum well, e.g. a CdHgTe-based heterostructure.

Figure 2:
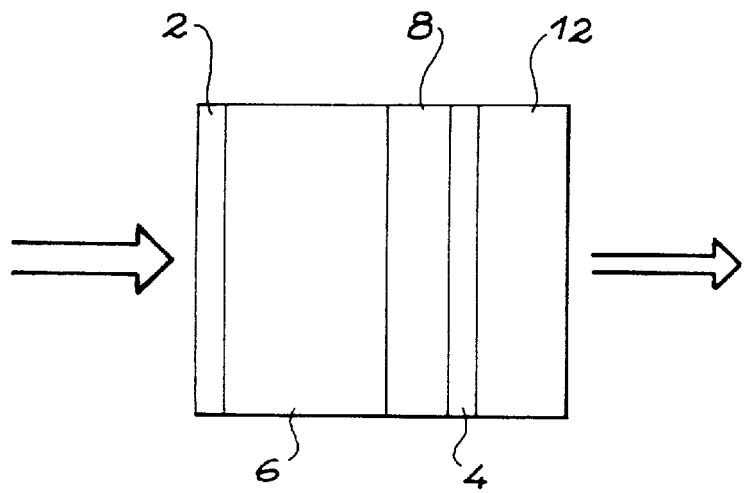

An example of the device according to the invention is illustrated in FIG. 2, where references 2 and 4 designate input and output mirrors of a microlaser cavity, which also has an active solid laser medium 6 and active or passive mode switching means 8 for said microlaser cavity. The cavity can be pumped by means not shown in the drawing, the pumping beam being designated 10. The pulses emitted by the microlaser will be absorbed by the semiconductor element 12, whose composition and structure can be as described hereinbefore. The semiconductor element 12 will e.g. be bonded to the output face of the microlaser.

The microlaser generally emits brief laser pulses of 1 to 5 nanoseconds and with a high peak power of several kilowatts at a high rate of 5 to 100 kilohertz with an emission wavelength around 1 μm (e.g. YAG:Nd at 1.064 μm). The absorption of the microlaser beam by the semiconductor will generate in the latter electron-hole pairs, which will be very rapidly combined in about 1 nanosecond in order to emit photons, whose wavelength is determined by the composition of the semiconductor, as explained hereinbefore. This very high speed of recombination of the electron-hole pairs justifies the need for a laser source emitting very short pulses. For this reason, a switched microlaser is very suitable for this application.

Another embodiment is illustrated in FIG. 3, where reference 14 designates the complete switched microlaser and 16 the semiconductor element. The latter is separated from the microlaser output face by spacing elements 18, 19. Moreover, means 22 for shaping the beam 20 emitted by the microlaser can be provided at the output of the microlaser 14. These means can e.g. be hybridized silica microlenses (by bonding or face-to-face contact) with the microlaser cavity output mirror. These means permit the focussing of the beam 20 on or in the semiconductor element 16.

Optical coating deposits can be made on the faces of the semiconductor element. For example and as illustrated in FIG. 4A, where identical references to those of FIG. 2 designate the same elements, an antireflection treatment coating 26 at the wavelength of the microlaser can be deposited on the input face of the semiconductor element 24, so that the beam from the microlaser enters the semiconductor element. An antireflection treatment coating 28 shown in broken line form in FIG. 4A at the emission wavelength of the semiconductor can be deposited on the output face of the latter, so that all the light produced by this element passes out by said face.

Another variant is illustrated in FIG. 4B, where identical references to those of FIG. 4A designate the same elements, references 30 and 32 designating the input and output mirrors of a laser cavity also having a semiconductor element 24. This laser cavity makes it possible to obtain a laser beam emitted by the semiconductor. The mirrors 30, 32 must have the following characteristics:

input mirror 30 (preferably a dichroic mirror): maximum transmission at the microlaser wavelength and maximum reflection at the semiconductor wavelength, output mirror 32 (preferably a dichroic mirror): transmission of a few per cent at the wavelength of the beam emitted by the semiconductor.

In all cases, the deposits of optical coatings or films can be constituted by dielectric multilayers. The mirror deposits can optionally be constituted by epitaxially produced semiconductor multilayers.

In the embodiment of FIG. 4B, the semiconductor laser is in direct contact with the output mirror 4 of the microlaser. However, the input mirror 30 of the semiconductor laser can be located at a certain, non-zero distance from the microlaser output mirror 4, e.g. with the aid of spacing elements as illustrated in FIG. 3, with or without intermediate focussing elements.

In all cases, the structure obtained is extremely compact, because the microlaser can have at the most a thickness of a few mm (taking account of the switching element 8) and the semiconductor element, with or without substrate, has a maximum thickness of about 1 mm. The structures described hereinbefore are therefore extremely compact, fool-proof and therefore no alignment is required during use. Moreover, all these structures are compatible with the mass production procedures used in microelectronics.

As illustrated in FIG. 5, a semiconductor laser of the VCSEL type (Vertical Cavity Surface Emitting Laser) can be pumped by a microlaser. The references 2, 4, 6, 8 designate the same elements as in FIGS. 4A, 4B and 2. The semiconductor laser cavity is defined by two mirrors 36, 38. The output mirror 38 is produced by epitaxy on a substrate 46 and has a high reflectivity at the semiconductor wavelength. In a VCSEL structure, the thickness of the Fabry-Perot cavity is very small (approximately 1 μm), so that it is possible to obtain a monomode laser. In FIG. 5, the reference 44 designates a film permitting the production of a quantum well structure. VCSEL lasers and their characteristics are e.g. described in "Surface emitting semiconductor laser" by K. IGA et al, IEEE J. Quantum Electronics, 24, p 1845, 1988.

A semiconductor laser pumped, according to the invention, by a microlaser can have, as illustrated in FIG. 6, a waveguide structure. Reference 48 designates the pumping microlaser, an active zone 50 of a semiconductor laser being deposited on a substrate 52. An infrared beam 54 is emitted by the semiconductor laser.

Another embodiment of a microlaser-pumped semiconductor laser is illustrated in FIG. 7. The active semiconductor zone 56 is deposited on a substrate 58 transparent to the wavelength of the pumping beam emitted by the microlaser. The substrate 58 can optionally rest on a second substrate 60 having the same transmission property at the same wavelength. The substrate 58 and active layer 56 are arranged substantially perpendicular to the pumping beam and the resultant emission follows a direction 62, which is itself perpendicular to said pumping beam. In order to obtain a beam parallel to the pumping beam mirrors 64, 66 can be deposited on etched faces of substrate 60. According to an embodiment, if the active zone is based on CdHgTe, the substrate 58 can be of CdZnTe, which is transparent at approximately 1 μm.

The constituent material of the active medium 6 of the microlaser will e.g. be doped with neodymium (Nd) for a laser emission at around 1.06 μm. This material can also be chosen e.g. from one of the following materials: p1 YAG ($Y_3Al_5O_{12}$), LMA ($LaMgAl_{11}O_{19}$), $YVO_4$, YSO ($Y_2SiO_5$), YLF ($YLiF_4$) or $GdVO_4$, etc.

Among the known materials, those most suitable for the operation of the microlaser are:

$YVO_4$, which has a good coefficient and a wide absorption band, together with a good effective cross-section, YAG, whose absorption coefficient and effective stimulated emission cross-section are average and whose absorption and emission band widths are low, it being in the form of large dimensions and has a good thermal conductivity, LMA: offers low absorption coefficient and effective cross-section, the absorption and emission bands being wide and it can also have large dimensions.

With regards to the active ions (dopants), they are generally chosen from among:

Nd for an emission around 1.06 μm,

Er or an erbium-ytterbium Er+Yb codoping for an emission around 1.5 μm,

Tm or Ho or a thulium and holmium codoping for an emission around 2 μm.

Another parameter is the thickness e of the active microlaser medium, which conditions the characteristics thereof:
- on the one hand the absorption of the pumping beam will be higher as the thickness e increases,
- on the other, the number of longitudinal modes of a Fabry-Perot cavity increases with the thickness and if it is wished to obtain a longitudinal monomode laser, said thickness must be small.

If dg is the width of the gain band of laser emission of the material, the number of modes N will be given by:

$$N = dg/dv \text{ with } dv = \frac{C}{2nL}$$

in which C is the speed of light and n the refractive index of the material.

For a monofrequency laser, generally the minimum thickness is chosen for N=1, provided that said thickness is >100 μm. The typical thicknesses for obtaining a single mode are:
YAG L=750 μm,
YVO$_4$ L=500 μm,
LMA L=150 μm.

In practice, the thickness e will consequently vary between 100 μm and approximately 1 mm.

To obtain a complete laser cavity, the active medium 6 with the switching element 8 is placed between two mirrors 2, 4. The input mirror 2, deposited by known processes, is preferably a dichroic mirror having a maximum reflectivity (as close as possible to 100%) at the wavelength of the laser and the highest possible transmission (>80%) at the wavelength of the pump (in general about 800 nm for Nd doped materials, 980 nm for Er doped materials and 780 nm for Tm doped materials). The output mirror 4 is also preferably dichroic, but permits the passage of a few percent of the laser beam.

The pumping of the microlaser cavity is preferably an optical pumping. Thus, the III–V laser diodes are particularly suitable for pumping a microlaser cavity.

Optionally, it is possible to produce by a prior art method (A. Eda et al, CLEO'92, paper CWG33, p 282 (Conf. on Laser and Electro-optics, Anaheim, U.S.A., May 1992)) a microlens array of a transparent material (silica, etc.) on the input surface of the laser material 6. The typical microlens dimensions are diameter 100 to a few hundred microns and radii of curvature of a few hundred micrometers to a few millimeters.

These microlenses are used for producing "stable" cavities (the plane-plane cavity not being stable) and which are of the planoconcave type. In the case of an optical pumping, they also make it possible to focus the pumping beam and reduce the size of the beams, both in the microlaser cavity and in the semiconductor medium. Examples of such structures are described hereinafter in conjunction with FIGS. 12 to 15.

The stabilization of the cavity also makes it possible to reduce therein losses and increase its operating efficiency.

The method described hereinbefore can also make it possible to produce microlenses at the output of the semiconductor, which makes it possible to shape the semiconductor output beam. Such a structure is illustrated in FIG. 8, where the pumping microlaser is designated by reference 68 and the semiconductor element by 70, a microlens 72 being formed at the output of the element 70. According to a variant (FIG. 9), a microlens 74 can be previously produced in a material, e.g. silica and then fixed to the path of the infrared beam emitted by the semiconductor. It can e.g. be bonded to the output face of the latter.

According to a special embodiment, the microlaser cavity is passively switched. In this case, the switching element 8 is a saturable absorber element.

According to a particularly advantageous embodiment, the saturable absorber is in thin film form. It can in particular be advantageous to deposit the saturable absorber film directly on the laser amplifier medium.

Two film types can be used:
- a polymer containing saturable absorber molecules and typically for a microlaser at 1.06 μm, it is possible to use as the saturable absorber an organic dye such as bis(4-diethylaminodithiobenzyl)nickel (BDN, Kodak, CAS No. 51449-18-4) in a solution containing by weight 6% polymethyl methacrylate (PMMA) in chlorobenzene.

Variants are described hereinafter in conjunction with the description of a preparation process.

This type of solution is deposited with the trammel directly on the laser material (cf. hereinafter for the preparation process). This leads to films having a thickness of about 1 to 5 μm, e.g. 2, 3 or 4 μm.

Another type of film is obtained by liquid phase epitaxy (LPE), directly on the laser material or any other process making it possible to obtain the same deposit (same material, same doping, same properties). Therefore generally the film will have been obtained by LPE. The LPE preparation process is described hereinafter and makes it possible to obtain, on the substrate constituted by the solid active medium, a film of thickness between 1 and 500 μm (e.g. 100, 200, 300 and 400 μm). It is constituted by a basic material identical to that of the solid active medium (e.g. YAG), but it is doped with ions giving it saturable absorber properties, e.g. $Cr^{4+}$ for a laser at 1.06 μm or $Er^{3+}$ for a laser at 1.5 μm.

Thus, the dopant type is adapted to the laser which it is wished to switch, so that the epitaxied layer has a saturable absorption at the emission wavelength of said laser.

Consequently, in this case, the active laser material and the saturable absorber film have the same crystalline structure and only differ by the different dopants affecting the crystalline and optical properties of said two media. The properties of the film in the two cases will consequently be very different.

Thus, the damage threshold is defined for each film type. Beyond a certain power density present in the laser cavity, it is possible to destroy the thin saturable absorber film. This limit power density known as the damage threshold will be lower in the case of the polymer with organic dye than in the case of the LPE-deposited film. Thus, in the first case it is necessary to work with lower energies deposited in the cavity than in the second case.

Moreover, in one case, the index difference between the laser material and the polymer introduces an optical interface between the two media. In the other case, LPE can only be carried out on the same material (e.g. YAG on YAG, only the doping differing), which makes it possible to adjust the index of the epitaxied layer to that of the active laser medium serving as the epitaxy substrate and therefore avoid the formation of an optical interface between the two media.

Finally, the nature of the film will influence the time form or shape of the laser pulse. In the case of the organic dye dissolved in a polymer, the dye decline time is very short (~1 ns), whereas in the case of the epitaxied film the ions constituting the impurities ($Cr^{4+}$, $Er^{3+}$) have slightly longer decline times (approximately a few nanoseconds). These properties will obviously condition the choice of film as a function of the intended use. In all cases, these decline times are compatible with the life periods of states excited in the semiconductor of a few hundred ps to 1 ns.

The structure described hereinbefore (saturable absorber in film form directly deposited on the active laser medium) makes it possible to obtain a compact microlaser cavity, requiring no alignment, requiring the introduction of no parasitic element such as an optical adhesive and also not requiring codoping of the same basic medium for forming, from said same basic medium, the active laser medium and the passive switching element.

Figure 10A:
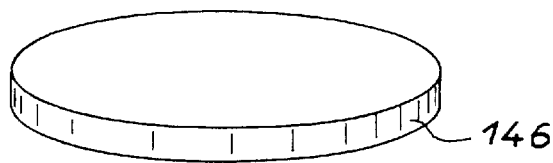

A process for the production of a device according to the invention with a passively switched microlaser will now be described for implementing a structure like that of FIG. 2. The following stages occur in this process:

1) The active laser material is chosen and conditioned, being oriented and cut into plates 146 of thickness between 0.5 and 5 mm (FIG. 10A). The plates are then ground and polished, so that the final, desired thickness e is obtained.

Figure 10B:
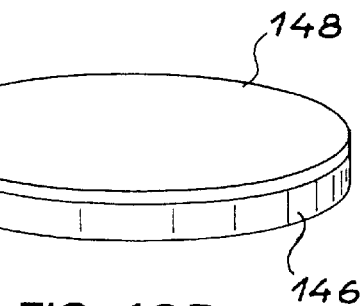

2) A stage of preparing the saturable absorber 148 (FIG. 10B).

2a) In the case of a conventional saturable absorber various processes are known making it possible to obtain a switched microlaser cavity. In particular, it is possible to carry out a codoping of the basic material of the active laser medium to give it properties of the active laser medium and saturable absorber (e.g. YAG doped with neodymium $Nd^{3+}$ and chromium $Cr^{4+}$ ions).

2b) In the case of a saturable absorber deposited in thin film form, two types of deposit can be implemented:

2b1) First deposit type: deposit of a saturable absorber organic dye dissolved in a polymer.

Typically, for a microlaser operating at 1.06 $\mu$m, it is possible to use as the saturable absorber an organic dye such as bis(4-diethylaminodithiobenzyl)nickel (BDN, Kodak, CAS No. 51449-18-4) in a polymethyl methacrylate (PMMA) solution. For this purpose, preparation takes place of a solution containing 6% by weight polymethyl methacrylate (Polyscience average weights) in chlorobenzene (Prolabo) whilst stirring for 24 hours. To it is added 0.2 wt. % BDN, accompanied by stirring for a further 2 hours. The solution is then filtered and deposited on the output substrate face in dropwise manner with a circular centrifugal movement. For said trammel deposition it is possible to use a standard machine such as that used in microelectronics for depositing resins used in lithography operations. The substrate is previously cleaned with respect to all traces of impurities resulting from the polishing operation. It is rotated (trammel) for 20 seconds at 2000 r.p.m. and then for 30 seconds at 5000 r.p.m. The film is finally dried for 2 hours in an oven at 70° C.

This gives a 1 $\mu$m thick film containing 3% active molecules (BDN) and whose optical density is 0.13 at 1.06 $\mu$m (74% transmission) before saturation.

By varying the concentration parameters of the polymer, its molecular weight or its solvent, the dye proportion and the trammel rotation speed, it is possible to adjust the saturable absorber performance characteristics. The typical specifications obtained are:
film thickness: 1 to 5 $\mu$m (e.g. 2, 3 or 4 $\mu$m),
molecule density: 5 to 10 wt. %,
dye: BDN, mm=685 g,
glass transition point: Tg=78° C.,
absorption at 1.06 um: 10 to 70%,
saturation level: 90%,
effective cross-section: $10^{-16}$ $cm^2$,
saturation intensity: 0.1 to 1 $MW/cm^2$,
film non-uniformity: <5% on 1 $cm^2$,
depolarization level: $<10^{-5}$,
losses at 800 nm: <1%,
repetition frequency: 10 to 10,000 Hz,
photostability: $10^8$ strokes.

Other polymers such as polyvinyl alcohol, polyvinyl acetate or polystyrene can be used in their respective solvents in place of PMMA. It is also possible to use as the dye bis(4-dimethylaminodithiobenzyl)nickel (BDN, Kodak, CAS No. 38465-55-3).

The dye can also be incorporated into a silica gel or grafted to the polymer chain.

Numerous other dithiene metal complexes can be used as a dye for other wavelengths, as described in the articles of K. H. Drexhage et al, Optics Communication 10(1), 19, 1974 and Mueller-Westerhoff, Mol. Cryst. Liq. Cryst., 183, 291, 1990.

The method can also be used for switching lasers operating at wavelengths other than 1.06 $\mu$m. For example switching will take place of Er or Er+Yb lasers (Er or Er+Yb doped materials where the active ion is Er) emitting at around 1.5 $\mu$m with tetraethyloctahydrotetraazapentaphene-dithiolato-nickel (cf. the aforementioned Mueller-Westerhoff article).

2b2) Second deposit type: deposit of a film by liquid phase epitaxy (LPE).

The saturable absorber (S.A.) film is obtained by soaking the substrate on which it is deposited in an appropriately chosen supersaturated solution. This solution or epitaxy bath is a mixture of a solvent and a solute constituted by different elements forming the final material. The substrate and the film have the same crystalline structure and only differ by the different dopants affecting the crystalline and optical properties of the film. The active ions such as Nd, Er and Yb make the material amplifying, whilst other ions (Cr, Er) give it S.A. properties and certain others can be used for varying the refractive index or crystal lattice of the material (e.g. Ga, Ge, Lu, etc.). It is thus possible to control the properties of the films produced.

This process can be applied to any material in monocrystal form (for the production of substrates) and which can be prepared by liquid phase epitaxy. This is the case with the aforementioned materials for the basic material of the active laser medium: $Y_3Al_{15}O_{12}$ (YAG), $Y_2SiO_5$ (YSO), $YVO_4$, $YLiF_4$ (YLF) or $GdVO_4$. The composition of the bath (choice of solvent and substituents), the concentrations in the solute of the different oxides and the experimental growth conditions (temperature range, operating procedure, etc.) are adjusted for each material so as to obtain films having the optimum crystalline quality.

In the case of garnets (YAG), the chosen solvent is a $PbO/B_2O_3$ mixture and the solute comprises an $Al_2O_3$ excess in order to stabilize the garnet phase. The solute/solvent ratio is then calculated so as to obtain growth at 1000° C.

As a function of the bath composition, the temperature and the deposition time, it is possible to adjust the thickness ($1 \leq e \leq 200$ $\mu$m, e.g. 25 $\mu$m, 50 $\mu$m, 75 $\mu$m, 100 $\mu$m, 125 $\mu$m, 150 $\mu$m, 175 $\mu$m, and it is also possible to obtain $e \geq 200$ $\mu$m) and the dopant concentration in the films. A film is grown at constant temperature, which makes it possible to obtain a uniform dopant concentration in the thickness of the film. The substrate is subject to a uniform or alternating rotary movement, which gives a good thickness uniformity.

It is also possible to produce a substrate carrying one or two S.A. films, as a function of whether soaking takes place of the surface of one face of the active laser material in the bath or both faces thereof, the laser material being totally immersed in the bath.

The epitaxied face or faces obtained can be repolished in order to remove any roughness which may have resulted from the epitaxy process and therefore the thickness of the epitaxied film or films is brought to the thickness desired for the operation of the microlaser.

Figure 10C:
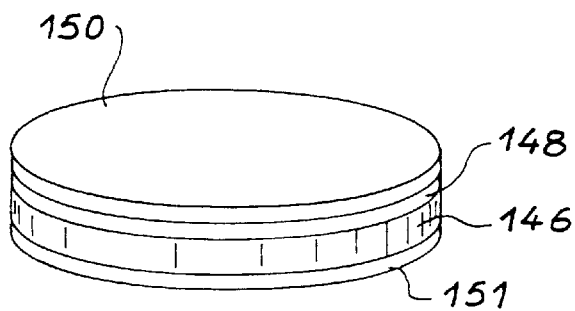

3) A stage of depositing mirrors 150, 151 of the microlaser cavity (FIG. 10C). These can be dichroic mirrors obtained by a deposition of dielectric multilayers, said process being known and commercially available.

4) A stage of producing the semiconductor portion having a composition and structure as described hereinbefore (a few micron film epitaxied on a substrate, heterostructure with or without quantum wells, etc.). Optionally, this stage is completed by a mirror deposition stage, e.g. for producing a structure like that of FIG. 4B or 5.

Figure 10D:
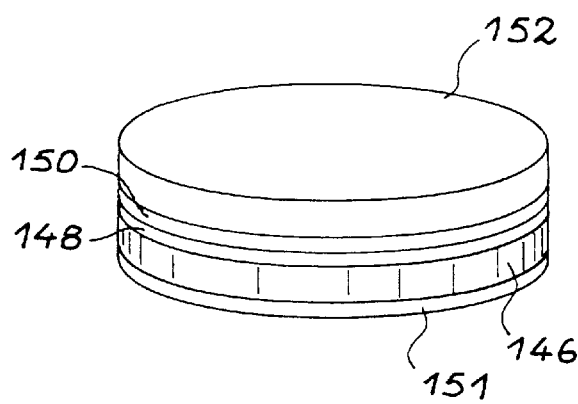

5) A fixing stage, e.g. by bonding of the semiconductor structure 152 obtained through the preceding stage on the output mirror of the microlaser (FIG. 10D).

In order to obtain a structure like that of FIG. 3, there is obviously no direct bonding to the microlaser.

Figure 10E:
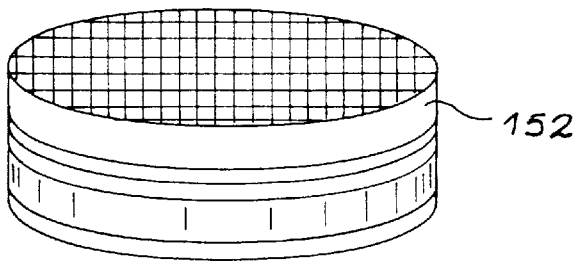

6) A stage of cutting plates in order to obtain microlaser chips (FIG. 10E, where the marks designate the cutting lines).

The small plates having the mirrors, saturable absorber, active laser medium, semiconductor element and optionally microlenses are cut by a disk saw in order to obtain chips with a cross-section of a few $mm^2$ and a thickness of approximately 1 to 2 mm, i.e. a volume of about 1 to 2 $mm^3$.

In order to produce another structure, the expert can adapt the above stages. For example, for a structure like that of FIG. 4A, there is an intermediate stage of depositing optical films 26 and 28.

The structure of FIG. 7 requires the preparation of a substrate 60, but the additional stages involved fall within the routine activity of the expert.

Figure 11:
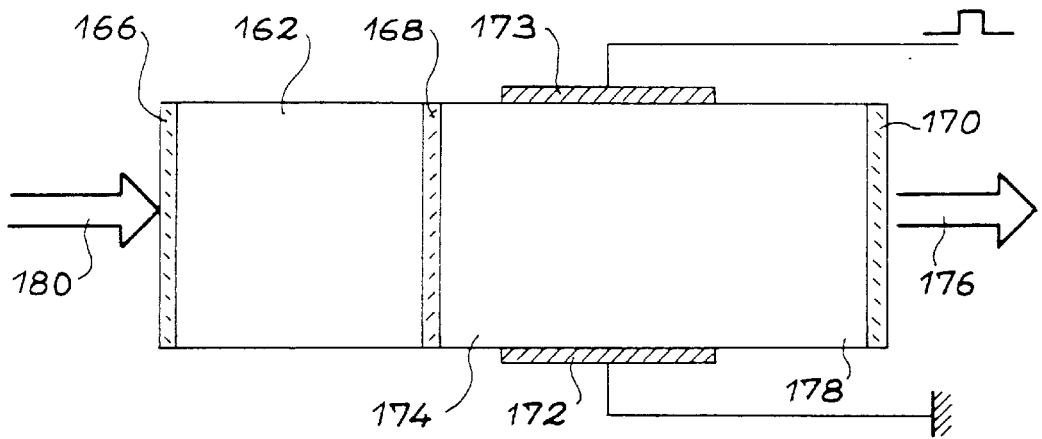

According to another embodiment of the invention, the microlaser cavity and microlaser are actively switched. An example of such a microlaser structure is illustrated in FIG. 11 (the semiconductor element not being shown), where the reference 162 designates the active laser medium, which forms a first resonant cavity between an input mirror 166 and an intermediate mirror 168. A second resonant cavity is formed between the intermediate mirror 168 and the output mirror 170. This second resonant cavity has an element 174, whose optical index can be modulated by an external disturbance. In particular, said material can be an electrooptical material, e.g. $LiTaO_3$. An external control voltage can be applied to electrodes 172, 173 and the application of said voltage leads to the establishment of an electric field in the material 174 and to a modification of its index. This modification affects the coupling of the two cavities and modifies the reflectivity of the intermediate mirror 168 seen by the active laser medium.

Figure 12:
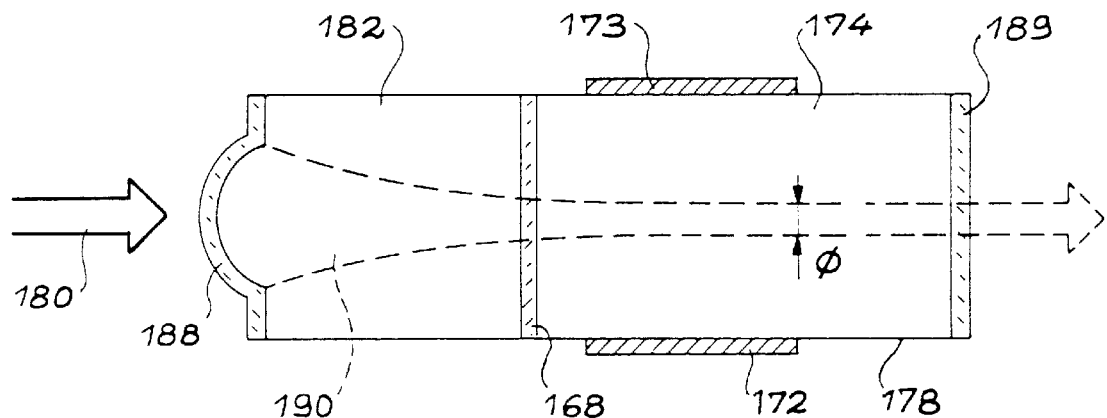
Figure 13:
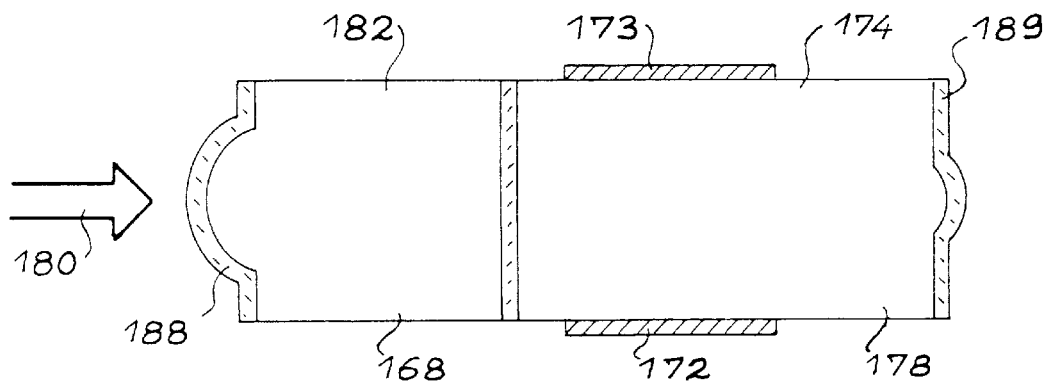

This embodiment can be further improved by adding laser beam size reduction means, which are located at the input of the first resonant cavity, the assembly of the two cavities and the laser beam reduction means being monolithic. This improvement is shown in FIGS. 12 and 13, where elements identical or corresponding to those of FIG. 11 are given the same references. Laser beam size reduction means 190 are 188 in each of the drawings. These means are in fact constituted by a micromirror 188 formed on the face of the active laser material 182 to be traversed first by the pumping beam 180.

With this structure, it is possible to bring the overall thickness of the microlaser and in particular that of the material 174 to approximately 100 $\mu$m. In the case of an electrooptical material 174, this makes it possible to limit the voltage necessary for application between the electrodes 172, 173 to between 50 and 100 V. However, in the embodiment of FIG. 11 (all the microlaser mirrors being planar) high voltages which can reach several hundred volts, namely 100 V must be applied between the electrodes 172, 173 in order to obtain an adequate index variation to switch the cavity. When the laser beam size reduction means are provided in the cavity, the microlaser switching threshold is reduced to approximately a few milliwatts. The operation of the semiconductor microlaser assembly is then of an optimum nature.

Preferably, the radius of curvature of the micromirror 188 exceeds the total length of the microlaser (length $L_1$ of active medium 182+length $L_2$ of medium 174). Typically the radius of curvature exceeds approximately 1.5 to 2 mm. With this condition, an optically stable cavity is obtained, and a diameter $\Phi$ of the laser beam 190 within the medium 174 of a relatively small size, typically a few dozen micrometers (compared with approximately 120 $\mu$m in the embodiment of FIG. 11).

As illustrated in FIG. 13, it is also possible to obtain a structure in which a concave micromirror 189 is provided at the output of the second cavity.

Moreover, the radii $R_1$ and $R_2$ of each of the micromirrors 188, 189 can be chosen so as to obtain two optically stable cavities. This condition is in fact fulfilled for: $R_1 > L_1$ and $R_2 \geq L_2$. The case of the planoconcave cavity of FIG. 12 corresponds to $R_2 = \infty$.

It is also possible to use as the variable index medium $n_2$ as an alternative to the electrooptical element 174:
either a magnetooptical material whose index $n_2$ is modified in response to an external magnetic field, e.g. with the aid of an electromagnet located in the vicinity of said material,
or a material whose index is a function of the temperature or pressure variations imposed from the outside.

The microlaser structures described hereinbefore can be combined with a semiconductor element, as has already been described in conjunction with FIGS. 2, 4A, 4B and 5 to 9. It is also possible to add spacing elements (such as elements 18, 19 in FIG. 3) between the output microlens of the microlaser (case of FIG. 13) and the semiconductor.

Another actively switched laser microcavity structure will now be described. Compared with the structure described hereinbefore (double Fabry-Perot cavity, FIGS. 11 to 13), the laser microcavity structure obtained is much simpler and solves the problem of the complexity of known actively operating microlaser structures. Moreover, like the embodiment described in conjunction with FIGS. 12 and 13, this structure makes it possible to reduce the control voltage required when an electrooptical material is used.

According to this embodiment, the microlaser cavity incorporates an active laser medium and two micromirrors forming a Fabry-Perot cavity, which is at the optical stability limit and means are provided for varying the optical length of the microlaser cavity so as to pass it from an optically unstable state to an optically stable state.

Thus, a new active switching is implemented, because the optically unstable state is a high cavity loss state as opposed to the optically stable state. This structure differs radically from the known structures, because there is only a single Fabry-Perot cavity.

Figure 14:
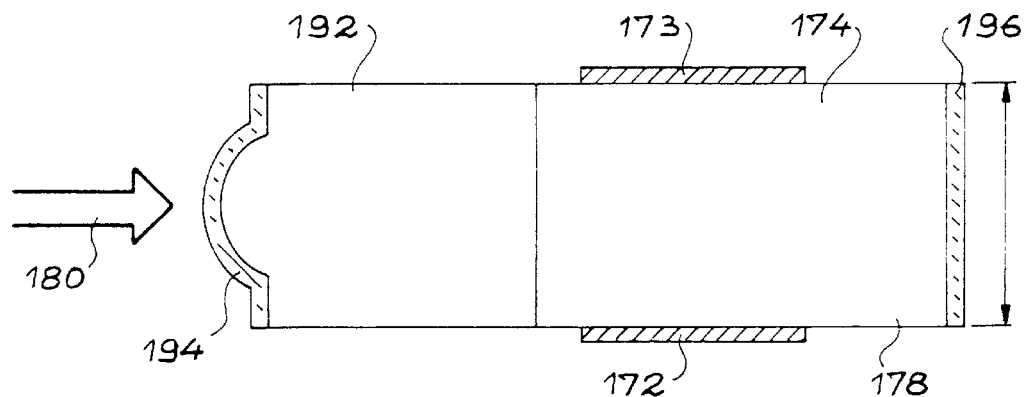
Figure 15:
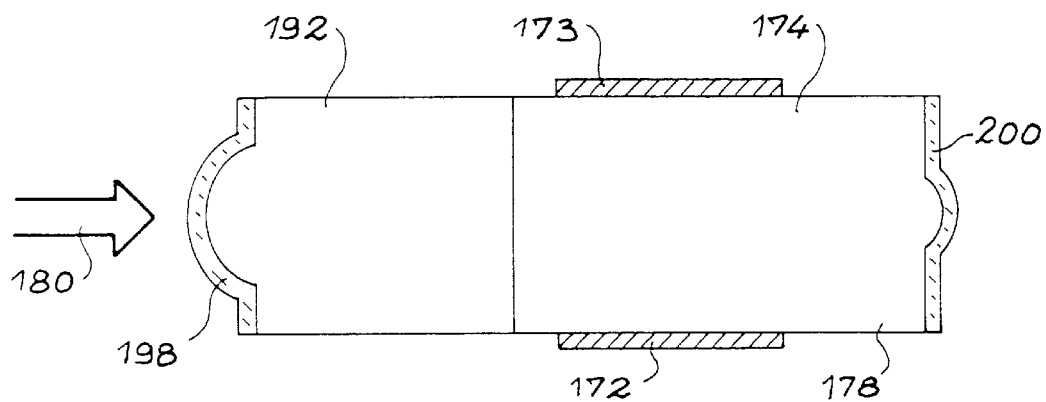

This embodiment is illustrated in FIGS. 14 and 15, where references 172, 173, 174, 180 designate elements identical to those of FIGS. 11 to 13 which are given the same references. Moreover, reference 192 designates the active laser medium, 194 and 198 a laser microcavity input mirror and 196, 200 a laser microcavity output mirror. The media 192 and 174 can be in contact with one another and an antireflection coating can be deposited at the interface 192-174. The microlaser cavity shown in FIG. 11 is a stability limit, hemispherical cavity. This is in the form of a single cavity produced with a laser material and another material, whose optical index can be varied by an external control voltage. Unlike in the case of two coupled cavities described in conjunction with FIGS. 11 to 13, these materials form a single Fabry-Perot cavity. The two materials 192 and 174 can be in contact by bonding or molecular adhesion. At the junction of these two materials, there can be a limited reflectivity of a few per cent due to the optical index differences of these two materials, but this limited reflectivity does not make it possible to obtain an adequate resonance in order to couple the two cavities in resonance, as in the prior art systems described.

The embodiment of FIG. 15 differs from that of FIG. 14 in that the output mirror 200 is a concave mirror with a radius of curvature $R_2$.

It is necessary to determine the characteristics of the mirror in such a way as to produce a cavity, e.g. confocal (with two concave mirrors as in FIG. 15) or hemispherical (planoconcave, as in FIG. 14), at the stability limit.

In the case of the hemispherical cavity, the stability will be obtained for $R_1 \geq L+(n_1/n_2-1)L_2$, with $L=L_1+L_2$.

In the case of the confocal cavity, the stability is obtained for:

$$R_1 \geq L+(n_1/n_2-1)L_2$$
$$R_2 \geq L+(n_2/n_1-1)L_1$$

Finally, for the concentric or spherical cavity, the relative condition for the stability is:

$$R_1 = R_2 = \frac{n_2 L_1 + n_1 L_2}{n_1 + n_2}$$

In each case, it is possible to vary either the index $n_2$, or the index $n_1$, or one of the lengths $L_1$ or $L_2$ so as to satisfy the corresponding inequation for bringing the cavity into a stable state. The variation of one of these parameters is obtained by external control means. As the optically stable state of the cavity corresponds to a low loss state and the optically unstable state to a high loss state, a novel means is provided for the active switching of a cavity.

In the case of the embodiments illustrated in FIGS. 14 and 15, the index $n_2$ of the electrooptical medium is modulated by the application of an electric field.

Alternatively, in order to modify the optical length of the cavity, it is possible to replace the electrooptical material 174 by:

- a magnetooptical material, whose index is modified in response to an external magnetic field, e.g. with the aid of an electromagnet located in the vicinity of said material,
- a material, whose index $n_2$ is dependent on the pressure, the index variation being obtained by a pressure variation.

It is also possible to modify the total geometrical length of the cavity by mounting the output mirror on piezoelectric means. This also leads to a controlled variation of the microlaser cavity optical length and permits the passage of the latter from an optically unstable state to an optically stable state.

The fact of using a hemispherical, confocal, concentric or spherical cavity makes it possible to concentrate the microlaser beam within the electrooptical material 174 when such a material is used. As the microlaser beam cross-section is reduced, it is possible to reduce the thickness of the material of index $n_2$. When use is made of an electrooptical material defining with the laser material a single cavity, it is thus possible to reduce the necessary distance between the contacting electrodes 172, 173 in order to obtain the field E necessary for the modulation of the index $n_2$. The voltage applied to the electrodes for obtaining the same field E is reduced by the same amount.

The microlaser structures described hereinbefore can be combined with a semiconductor element, as has already been described in conjunction with FIGS. 2 and 4A to 9. It is optionally possible to add spacing elements (like elements 18, 19 in FIG. 3) between the microlaser output microlens (FIGS. 15 and 17) and the semiconductor.

A process for the production of a device according to the structure of FIG. 2 with an actively switched microlaser will now be described. This process has the same stages 1 and 3 to 6 as described in conjunction with FIGS. 10A to 10E for the preparation of a device with a saturable absorber. The difference is in stage 2, because it is now a question of bringing about an active switching in the microlaser.

In the case of a microlaser structure with two coupled Fabry-Perot cavities (FIGS. 11 to 13), an intermediate mirror 168 is deposited on the laser material 162 (FIG. 16A). This is followed by the deposition on said mirror of a variable index material plate 174, e.g. an electrooptical material (LiTaO$_3$). Subsequently, after stage 3 and before stage 4, stages 3'-1 and 3'-4 are performed relating to the formation of the control electrodes 172, 173.

3'-1) The output face 115 of the microlaser is protected by a resin deposit 117.

3'-2) Grooves 119 are produced (FIG. 16B) in the electrooptical material with the aid of a diamond saw used in microelectronics, so as to be able to subsequently produce electrodes with the desired spacing.

3'-3) This is followed by the deposition of electric contacts by evaporation (e.g. deposition of a Cr—Au coating 121, which envelops the resin 117 and the electrooptical material).

3'-4) There is then a chemical etching of the protective resin 117 so as to leave behind metallizations on either side of the electrooptical material.

In the case of a microlaser incorporating a single Fabry-Perot cavity (FIGS. 14 and 15), there is no deposition of the intermediate mirror 168. An antireflection coating can then be deposited at the interface between the laser material plate and the electrooptical material plate. The two plates are then bonded to one another with an optical adhesive or assembled by any other process, e.g. molecular adhesion.

When micromirrors have to be formed on one of the faces of the cavity, use is made of photolithography (exposure of a photosensitive resin by UV radiation through a mask, followed by chemical development of the resin) and ion beam machining.

Figure 17:
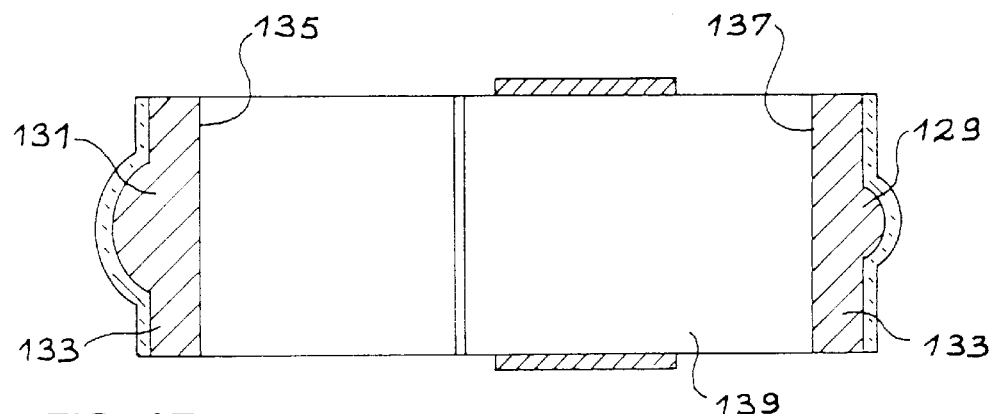
Figure 16:
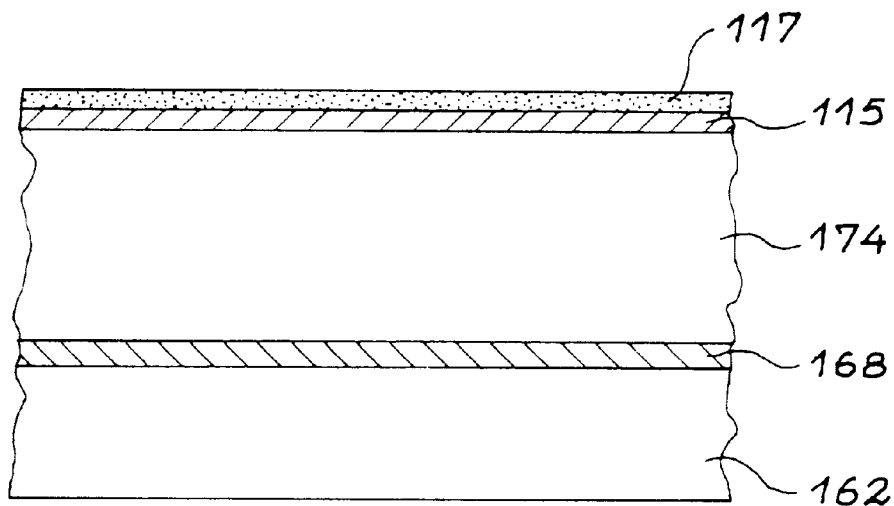
Figure 16:
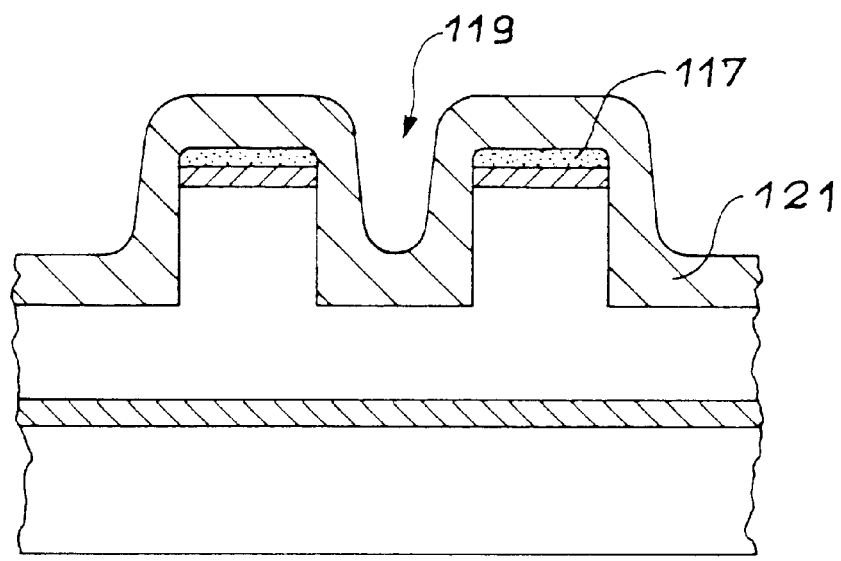

In the two active switching cases above (double cavity and single cavity) it is possible according to a variant to produce micromirrors with a variable density mask. Moreover and as illustrated in FIG. 17, plane or concave micromirrors 129, 131 can be produced on a material 133 such as glass or silica, which is transparent to the laser wavelength. These substrates with the micromirrors can then be joined to the input face 135 of the laser medium and output face 137 of the electrooptical material 139.

We claim:

1. Device for an infrared light emitter including a semiconductor element emitting infrared radiation and a microlaser, said microlaser comprising a switching means, an input face and an output face, said microlaser outputting a laser beam optically pumping the semiconductor element, the semiconductor element comprising one of $Pb_xSn_{1-x}Se$, $Pb_xSn_{1-x}Te$, $PbS_{1-x}Se_x$, $InAs_xSb_{1-x}$, $Cd_xHg_{1-x}Te$, $Cd_xPb_{1-x}dS$, and $Bi_{1-x}Sb_x$ ($0 \leq x \leq 1$) and the device operating at a temperature T>160 K.

2. Device according to claim 1, the semiconductor element comprising a semiconductor plate with a thickness below 500 micrometers.

3. Device according to claim 1, the semiconductor element comprising a semiconductor film epitaxied on a substrate.

4. Device according to claim 1, the semiconductor element being the gain medium of a semiconductor laser.

5. Device according to claim 4, the semiconductor laser being of the VCSEL (Vertical Cavity Surface Emitting Laser) type.

6. Device according to claim 4, the semiconductor laser being of the waveguide type, the semiconductor element consisting in a film of semiconductor material deposited on a substrate.

7. Device according to claim 6 said semiconductor film being oriented in a plane substantially perpendicular to the direction of said laser beam emitted by said microlaser.

8. Device according to claim 1, wherein said semiconductor element includes an input side and an output side through which an infrared beam is emitted, said device further including an optical means provided at the output side of said semiconductor element for shaping an infrared beam emitted by said semiconductor element.

9. Device according to claim 1, said microlaser cavity being a stable cavity.

10. Device according to claim 1, said switching means of said microlaser being passive switching means.

11. Device according to claim 10, the microlaser cavity including a solid active medium and a saturable absorber, the absorber comprising a thin saturable absorber material film directly deposited on the solid active medium.

12. Device according to claim 11, the film being formed from an organic dye dissolved in a polymer solvent.

13. Device according to claim 12, the organic dye being chosen from one of bis(4-diethylaminodithiobenzyl)nickel and bis(4-dimethylaminodithiobenzyl)nickel with the solvent being a solution of one of polymethyl methacrylate, polyvinyl alcohol, polyvinyl acetate and polystyrene.

14. Device according to claim 11, wherein the film is deposited by liquid phase epitaxy.

15. Device according to claim 14, said solid active medium being formed of a material doped with ions, and said film being formed from a material identical to that of the active solid material and doped with $Cr^{4+}$ or $Er^{3+}$ ions.

16. Device according to claim 1, the device operating at ambient temperature.

17. Device for an infrared light emitter including a semiconductor element emitting infrared radiation and a microlaser, said microlaser comprising a switching means, an input face and an output face, said microlaser outputting a laser beam for optically pumping the semiconductor element, the semiconductor element being directly fixed to the output face of the microlaser.

18. Device for an infrared light emitter including a semiconductor element emitting infrared radiation and a microlaser, said microlaser comprising a switching means, an input face and an output face, said microlaser outputting a laser beam for optically pumping the semiconductor element, optical means for shaping said microlaser beam emitted by said microlaser being provided between the microlaser and the semiconductor element.

19. Device according to claim 17 or 18, the semiconductor element comprising a semiconductor plate with a thickness below 500 micrometers.

20. Device according to claim 17 or 18, the semiconductor element comprising a semiconductor film epitaxied on a substrate.

21. Device according to claim 17 or 18, the semiconductor element comprising one of $Pb_xSn_{1-x}Se$, $Pb_xSn_{1-x}Te$, $PbS_{1-x}Se_x$, $InAs_xSb_{1-x}$, $Cd_xHg_{1-x}Te$, $Cd_xPb_{1-x}dS$, and $Bi_{1-x}Sb_x$ ($0 \leq x \leq 1$) and the device operating at temperatures T>160 K.

22. Device according to claim 17 or 18, the semiconductor element comprising one of $In_xGa_{1-x}As$, $InAs_xP_{1-x}$, $Cd_xZn_{1-x}S$, $(Al_xGa_{1-x})_yIn_{1-y}As$ and $(Al_xGa_{1-x})_yIn_{1-y}P$ ($0 \leq x \leq 1$ and x+y=1).

23. Device according to claim 17 or 18, the semiconductor element being the gain medium of a semiconductor laser.

24. Device according to claim 23, the semiconductor laser being of the VCSEL (Vertical Cavity Surface Emitting Laser) type.

25. Device according to claim 23, the semiconductor laser being of the waveguide type, the semiconductor element consisting in a film of semiconductor material deposited on a substrate.

26. Device according to claim 25, said semiconductor film being oriented in a plane substantially perpendicular to the direction of said laser beam emitted by said microlaser.

27. Device according to claim 17 or 18, optical means for shaping said microlaser beam emitted by said microlaser being provided between the microlaser and the semiconductor element.

28. Device according to claim 17 or 18, wherein said semiconductor element includes an input side and an output side through which an infrared beam is emitted, said device further including an optical means provided at the output side of said semiconductor element for shaping an infrared beam emitted by said semiconductor element.

29. Device according to claim 17 or 18, said microlaser cavity being a stable cavity.

30. Device according to claim 17 or 18, said switching means of said microlaser being passive switching means.

31. Device according to claim 30, the microlaser cavity including a solid active medium and a saturable absorber, the absorber comprising a thin saturable absorber material film directly deposited on the solid active medium.

32. Device according to claim 31, the film being formed from an organic dye dissolved in a polymer solvent.

33. Device according to claim 32, the organic dye being chosen from one of bis(4-diethylaminodithiobenzyl)nickel and bis(4-dimethylaminodithiobenzyl)nickel with the solvent being a solution of one of polymethyl methacrylate, polyvinyl alcohol, polyvinyl acetate and polystyrene.

34. Device according to claim 33, said solid active medium being formed of a material doped with ions, and said film being formed from a material identical to that of the active solid material and doped with $Cr^{4+}$ or $Er^{3+}$ ions.

35. Device according to claim 31, wherein the film is deposited by liquid phase epitaxy.

36. Device for an infrared light emitter including a semiconductor element emitting infrared radiation and a microlaser, said microlaser comprising an active switching means, an input face and an output face, said microlaser outputting a laser beam for optically pumping the semiconductor element, wherein the active switching means is an active laser medium of a first material having a first optical index which forms a first resonant cavity between an input mirror and an intermediate mirror, a second material has a second optical index and forms a second resonant cavity between the intermediate mirror and an output mirror said second optical index of said second material is modulated by one of an electric field, a magnetic field and a pressure variation, and a laser beam reduction means located at the input of the first resonant cavity, the assembly of said two cavities and of said laser beam reduction means being monolithic.

37. Device according to claim 36, the reduction means comprising a concave mirror produced with a micromirror on an input face of the active laser medium to be traversed by a microlaser pumping beam.

38. Device according to claim 36, the output mirror being a concave mirror produced with a micromirror on the output face of the second material.

39. Device according to claim 36, said active laser medium of a first material having two mirrors forming a Fabry-Perot cavity, which is at an optical stability limit, and means being provided for varying the optical length of the cavity so as to pass from an optically unstable state to an optically stable state.

40. Device according to claim 39, wherein the cavity in one of a hemispherical, confocal, concentric or spherical cavity.

41. Device according to claim 39, the cavity wherein said second material has variable optical length.

42. Device according to claim 41, wherein the means for varying the optical length of the cavity includes means for varying the length of said second material.

43. Optical parametric oscillator comprising a device according to claim 41, said first optical index being different from said second optical index, and said means for varying the optical length of said cavity comprising means for varying the second optical index of the second material.

44. Device according to claim 41 or optical parametric oscillator according to claim 43, said second material being an electrooptical material.

* * * * *